United States Patent
Yan

(12) United States Patent (10) Patent No.: US 8,022,739 B2
(45) Date of Patent: Sep. 20, 2011

(54) CHARGE PUMP CIRCUIT

(75) Inventor: Dan Lei Yan, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 20 days.

(21) Appl. No.: 12/439,330

(22) PCT Filed: Sep. 7, 2006

(86) PCT No.: PCT/SG2006/000261
§ 371 (c)(1),
(2), (4) Date: Nov. 9, 2009

(87) PCT Pub. No.: WO2008/030182
PCT Pub. Date: Mar. 13, 2008

(65) Prior Publication Data
US 2010/0090753 A1 Apr. 15, 2010

(51) Int. Cl.
*H03L 7/06* (2006.01)
(52) U.S. Cl. .................................................. 327/157
(58) Field of Classification Search ............ 327/147, 327/148, 156, 157
See application file for complete search history.

(56) References Cited

U.S. PATENT DOCUMENTS

| | | | |
|---|---|---|---|
| 5,576,647 A | 11/1996 | Sutardja et al. | |
| 5,602,794 A | 2/1997 | Javanifard et al. | |
| 5,760,640 A * | 6/1998 | Girard et al. | 327/543 |
| 6,075,406 A | 6/2000 | Lee et al. | |
| 6,124,755 A | 9/2000 | Parker et al. | |
| 6,265,946 B1 | 7/2001 | Bartlett | |
| 6,526,111 B1 * | 2/2003 | Prasad | 375/376 |
| 6,952,126 B2 | 10/2005 | Byun et al. | |
| 7,385,429 B1 * | 6/2008 | Mei et al. | 327/157 |
| 2005/0189973 A1 | 9/2005 | Li | |
| 2006/0055451 A1 | 3/2006 | Gu | |

OTHER PUBLICATIONS

De Muer, B., Steyaert, M., A CMOS Monolithic ΔΣ-Controlled Fractional-N Frequency Synthesizer for DCS-1800, IEEE Journal of Solid-State Circuits, vol. 37, No. 7, Jul. 2002.

* cited by examiner

*Primary Examiner* — Jeffrey S Zweizig
(74) *Attorney, Agent, or Firm* — Volpe and Koenig, P.C.

(57) ABSTRACT

A charge pump circuit and a method of compensating current mismatch in a charge pump circuit. The charge pump circuit comprises a core charge pump circuit; a replica charge pump circuit for sensing a current mismatch in the core charge pump circuit and for converting the sensed current mismatch into a voltage signal V_ctrl; wherein V-ctrl is utilized for compensating the current mismatch in the core charge pump circuit.

6 Claims, 6 Drawing Sheets

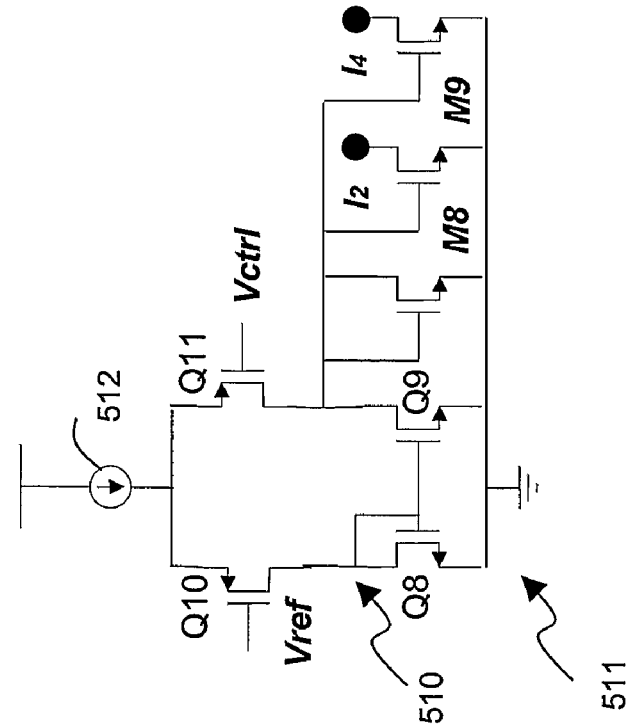
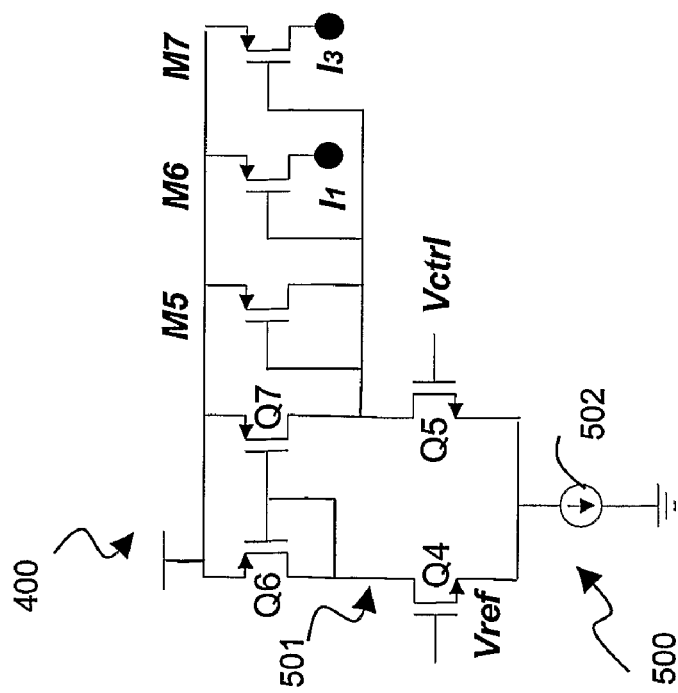
Figure 5 a)
Figure 5 b)

CHARGE PUMP CIRCUIT

FIELD OF INVENTION

The present invention relates broadly to a charge pump circuit and to a method for compensating current mismatch in a charge pump circuit.

BACKGROUND

A charge pump is an electronic circuit that uses switches to control the connections of voltages to double voltages, invert voltages, or generate arbitrary voltages, depending on the controller and circuit topology. An example for a charge pump circuit application is in phase locked loop circuits (PLL). For designing a charge pump circuit, an important objective is to minimize the mismatch between "up" (pull-up) and "down" (pull-down) currents. In an integer-N synthesizer, the current mismatch will cause the charge pump's output spectrum to have a higher reference spur. For fractional-N synthesizer, the current mismatch will cause an extra problem, known as higher in-band phase noise.

FIG. 1 shows an existing charge pump circuit that attempts to deal with the mismatch problem between currents "up" and "down". In this circuit, the original current source I_bias is mirrored to a common current branch for presenting "up" (I_up) and "down" (I_down) currents to N-MOS transistor M1 and P-MOS transistor M2 respectively. Between these two current carrying transistors (M1, M2), there are four trans-gate switches (S1, S2, S3 and S4) of the same size and they form the current branch 101 (S1 and S2) parallel to a dummy branch 100 (S3 and S4). Each branch has its two trans-gate switches serially connected. The charge pump output voltage V_ds is taken at the CP_out point between S1 and S2 and a reference voltage V_ref is taken between S3 and S4. Linking charge pump output (V_ds) and the voltage reference V_ref, a negative feedback is formed via an Operational Amplifier (Op) so that the voltage value V_ref follows V_ds. In these branches, D and U are digital signals from a phase frequency detector (PFD) to control the trans-gate switches (S1 to S4) so that the pumping of the positive and negative current (CP_out) is regulated. In this circuit, a charge injection is minimized by implementing the identical switches (S1 to S4) with a minimal size and the possible overlap charge injection is reduced by fine-tuning the size of current carrying transistors (M1, M2). During operation, M1 and M2 are not switched on or off to prevent current switching effects on the drain of the current sources. When the charge pump is off i.e. both S1 and S2 are closed, the current is diverted into a dummy current branch 100 via S3 and S4.

In the charge pump circuit, there exists a systematic current variation due transistor mismatch between M1 and M2. Consequently, the resulting current mismatch of the charge pump circuit is in practice difficult to avoid.

Referring to FIG. 2, the simulation result for the charge pump circuit of FIG. 1 is shown. The vertical axis represents the electric current value and the horizontal axis gives the reference voltage V_ref (0~1.8V) value, which follows the charge pump output voltage V_ds. The current passing through M1 (100 μA) is marked with I_up (curve 200) and the current passing through M2 (−95 μA) is marked with I_down (curve 202). The current mismatch is illustrated by the current_mismatch curve 204. It can be observed that the circuit is not able to compensate the current mismatch and resulted current mismatch is quite large.

Another existing charge pump circuit is illustrated in FIG. 3. The charge pump connects an original current source (I_bias) with a feedback network portion 300, a core charge pump portion 302 and a replica bias portion 304. This circuit uses the replica bias circuit 304 to equalize up and down currents regardless of the charge pump's output voltage V_ds. However, the voltage range V_ds of this charge pump is narrow which inhibits the feedback loop from operating properly. Such charge pump circuits cannot have good current match and are limited in terms of dynamic voltage range.

There are some charge pump circuits using digital circuits to control current mismatch. However, the digital circuit has to be turned on at all times to achieve good current match, which causes problems to the charge pump circuit.

A need therefore exists for compensating current mismatch in a charge pump circuit that seeks to address at least one of the above problems.

SUMMARY

In accordance with a first aspect for the present invention there is provided a charge pump circuit comprising a core charge pump circuit; a replica charge pump circuit for sensing a current mismatch in the core charge pump circuit and for converting the sensed current mismatch into a voltage signal V_ctrl; wherein V-ctrl is utilised for compensating the current mismatch in the core charge pump circuit.

The core charge pump circuit may include a first n-type transistor and a first p-type transistor, parallel first and second branches between respective drains of the first n-type and the first p-type transistor, each branch including two switch elements, and a voltage follower circuit connected between a V_ref input point and a CP_out point between the switch elements on the first and second branches respectively;

the replica charge pump circuit may include a second n-type transistor and a second n-type transistor, two switch elements of the same type as the switch elements of the core charge pump circuit connected in series between the drains of the second n-type and the second p-type transistor; and a feedback loop with one input taken from a point between the two switch elements of the replica charge pump circuit and V_ref supplied to another input of the feedback loop and V-ctrl as the output of the feedback loop.

The charge pump circuit may further comprise a first current compensating circuit for converting V_ctrl into a compensating "up" current, and a second current compensating circuit for converting V_ctrl into a compensating "down" current.

The compensating "up" current may be supplied to the drains of the first and second n-type transistors, and the compensating "down" current is supplied to the drains of the first and second p-type transistors.

The first and second compensating circuits may comprise respective differential circuits for converting a voltage difference between V_ref and V_ctrl into the compensating "up" and "down" currents respectively.

The switch elements may comprise trans-gate switches.

Current mismatch may be substantially compensated over a range of more than about 1 V in variation of V_ref.

In accordance with a second aspect of the present invention there is provided a method of compensating current mismatch in a charge pump circuit, the method comprising sensing the current mismatch in the charge pump circuit; converting the sensed current mismatch into a voltage signal V_ctrl; and utilising V-ctrl to compensate the current mismatch.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 5 shows up and down current supply circuits connected to the charge pump circuit of FIG. 4.

DETAILED DESCRIPTION

Figure 1:
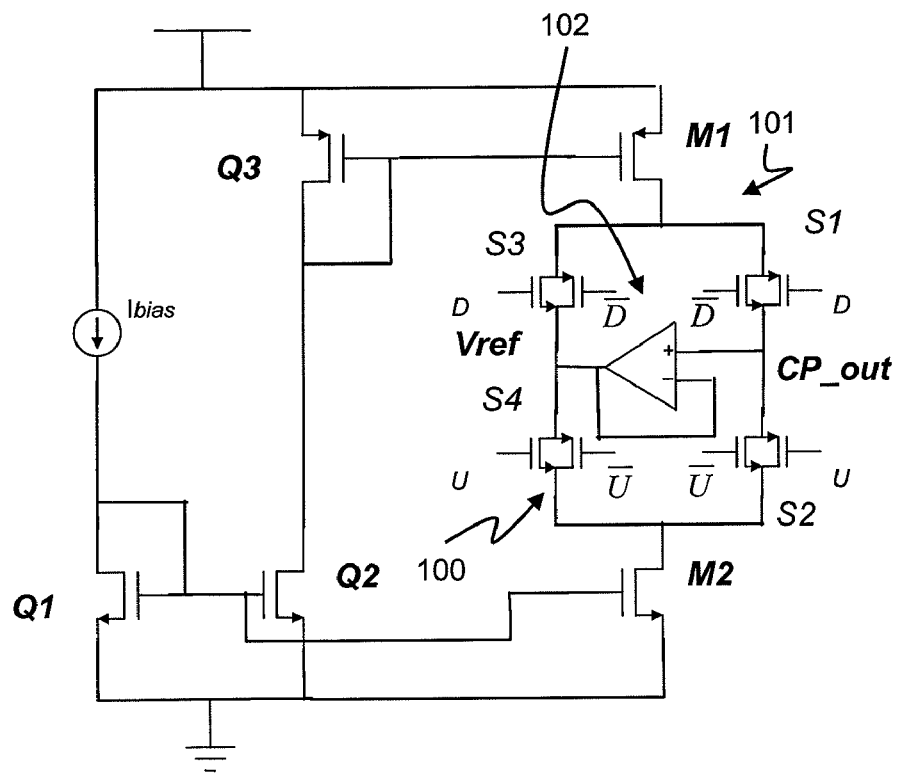
FIG. 1 shows a circuit diagram of an existing charge pump circuit for compensating up and down current mismatch.
Figure 2:
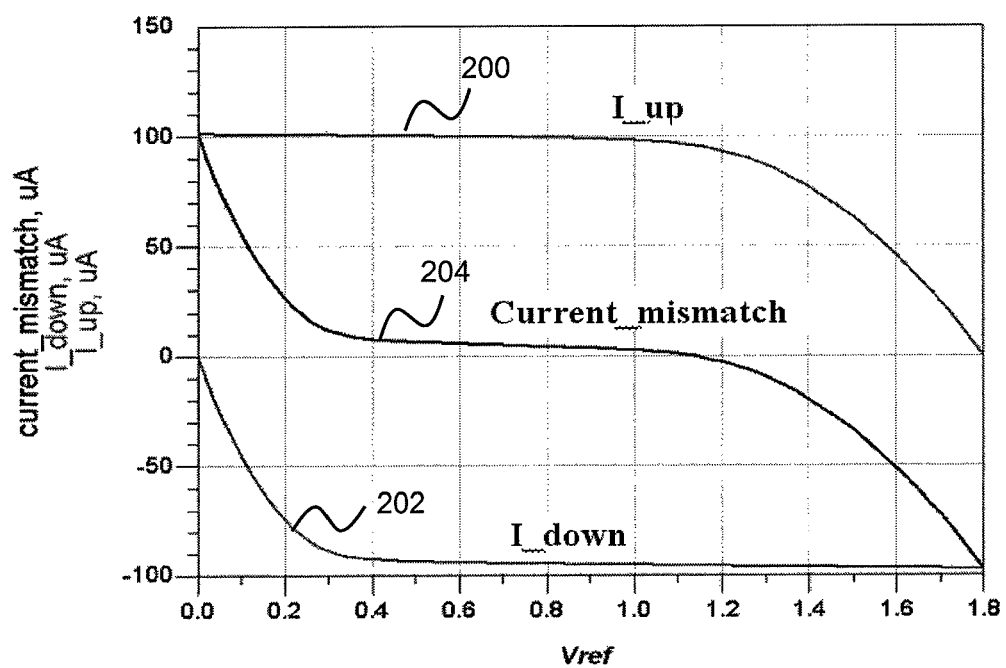
FIG. 2 shows a simulation result for the current mismatch of the charge pump circuit of FIG. 1.
Figure 3:
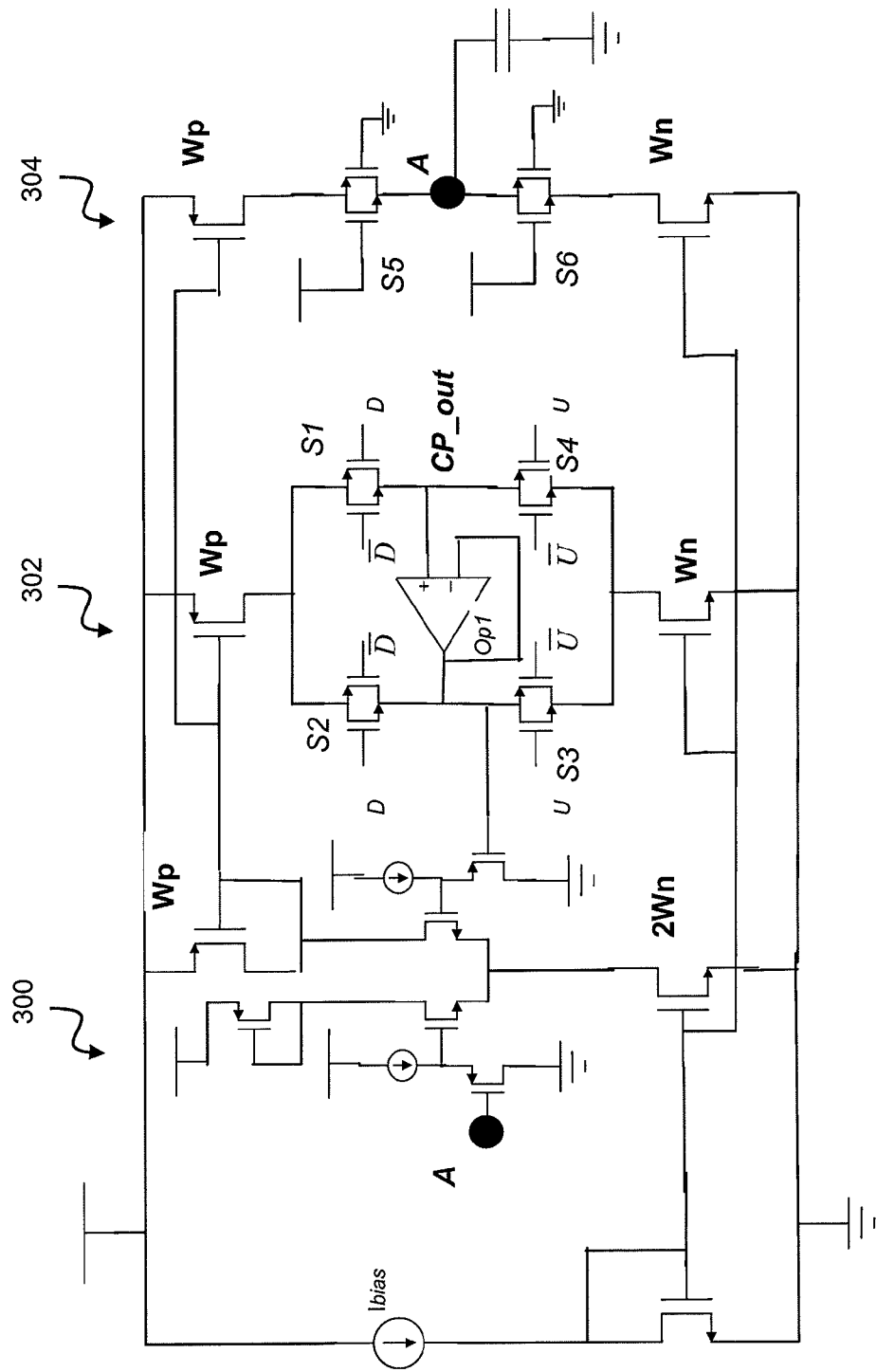
FIG. 3 shows another existing charge pump circuit for reducing current mismatch.
Figure 4:
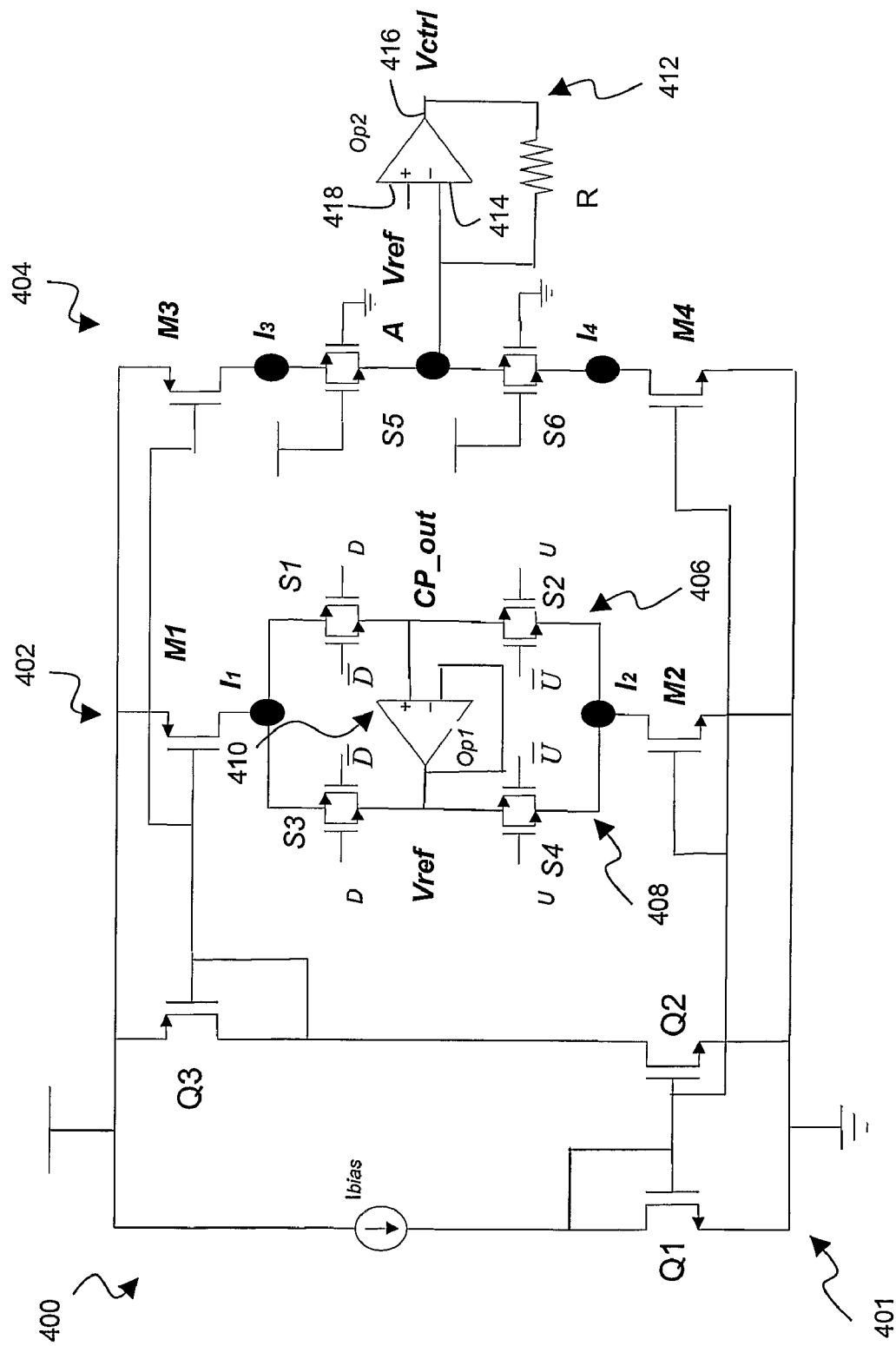
FIG. 4 shows a circuit diagram of a charge pump circuit with a replica charge pump.

Referring to FIG. 4, a charge pump circuit for reducing current mismatch is disclosed. The charge pump comprises three portions, namely a current source portion 400, a core charge pump portion 402 and the replica charge pump portion 404.

The current source portion 400 comprises an original current source I_bias and three transistors (Q1, Q2, Q3). These transistors mirror the current from the original current source I_bias to give positive and negative output currents. In particular, the original current I_bias connects to the source of Q3 and drain of Q1. The drain of Q1 and gates of Q1 and Q2 are joined together. The sources of Q1 and Q2 are connected to ground. The gate of Q3 is connected to its drain and further to the drain of Q2. The source of Q3 as well as the original current source I_bias are connected to a positive supply voltage V_dd.

The core charge pump circuit 402 is connected to the mirrored current sources for receiving up and down currents. At the up current side of M1, the source of M1 is connected to the source of Q3 and the gates of M1 and Q3 are jointly connected to the drain of Q2. At the down current side, the source of M2 connects the sources of Q1 and Q2 to ground. The gates of M2, Q2 and Q1 are connected together to the original current source I_bias directly.

Between the up and down current carrying transistors M1 and M2, there are two parallel branches comprising four trans-gate switches, namely S1, S2, S3 and S4. S1 and S2 are serially connected between M1 and M2 to form a current branch 406 and the charge pump output V_ds (CP_out) is taken between the trans-gate switches S1 and S2. Parallel to S1 and S2, S3 and S4 are serially connected to form a dummy branch 408 between M1 and M2 where the voltage reference V_ref is taken between the switches S3 and S4. The reference voltage V_ref is also at the output of an Operational Amplifier (OPAMP) Op 1 and control signals D and U for the trans-gate switches (S1, S2, S3 and S4) are taken from a Phase Frequency Detector (PFD).

Between the current branch 406 and the dummy branch 408, a negative feedback loop 410 (voltage follower) is formed by Opt between the charge pump output 411 and the reference voltage V_ref.

The replica charge pump circuit 404 is used for sensing the current mismatch of the core charge pump 402. Within the replica charge pump in out 404, a feedback loop 412 is used to convert the sensed current mismatch into a voltage signal, V_ctrl.

The replica charge pump circuit 404 has two transistors (M3 and M4) and two trans-gate switches (S5 and S6). M3 and M4 have the same size as M1 and M2 while S5 and S6 have the same size as S1 to S4. M3, S5, S6 and M4 are connected in series. The current mismatch due to the size mismatch and the drain voltages of transistors M1 and M2 can be compensated in the implementation shown in FIG. 4. It will be appreciated by a person skilled in the art that for M1 and M3, and for M2 and M4, a good match can be achieved, typically less than 1% in real circuits. The trans-gate switches S5 and S6 are maintained at an on state continuously during the charge pump's circuit 401 operation. Between the transgate switches S5 and S6, a connection marked as point A is coupled to a second Operational Amplifier Op2 to form the negative feedback loop 412.

The feedback loop 412 of the replica charge pump circuit 404 is formed around the Operational Amplifier Op2. Here, Op2 is a rail-to-rail OPAMP and it is used as trans-impedance amplifier (TIA). In particular, the input from point A is linked to the inverting input 414 and a control voltage V_ctrl is fed back from the output 416 of Op2 to the inverting input 414 via a resistor R. On the other hand, the reference voltage V_ref is supplied to the non-inverting input 418 of Op2.

For the "external" connections of the replica charge pump circuit 404, the source and gate of M3 are connected to the source and gate of M1 respectively. Similarly, the source and gate of M4 are connected to the source and gate of M2 respectively.

During operation, the current mismatch of the original charge pump output V_ds (at CP_out) is mirrored to point A by the replica charge pump circuit 404 and supplied to the second Operational Amplifier Op2, which is used as TIA. If the "up" current on M1 is lower than the "down" current, V_ctrl becomes higher than V_ref. If the "up" current is higher than the "down" current, V_ctrl becomes lower than V_ref. Thus, the mismatch in the "up" and "down" current is effectively converted into a differential voltage signal V_ctrl. Additional differential circuits are used to convert the V_ctrl into compensating current signals. The differential circuits are described below with reference to FIGS. 5(a) and (b).

The disclosed charge pump circuit of FIG. 4 has four additional current input connecting, labeled as I_1, I_2, I_3 and I_4. I_1 and I_3 are for receiving compensation "up" current while I_2 and I_4 are for receiving compensation "down" current. The compensating "up" current supply circuit is shown in FIG. 5(a) and the compensating "down" current supply is illustrated by FIG. 5(b).

Referring to FIG. 5(a), the compensating "up" current source 500 is regulated by V_ref and V_ctrl. In particular, there are seven transistors (Q4 to Q7 and M5 to M7) forming the current source. Q4 to Q7 form source loop 501 and M5 to M7 are connected in parallel. Within the loop, Q6's drain connects to Q4's drain and Q7's drain connects to Q5's drain. The sources of Q4 and Q5 are connected together to ground via a current source 502. The sources of Q6 and Q7 are connected to a positive voltage V_dd. The gates of Q6 and Q7 are also connected to the drain of Q4. V_ref is applied to the gate of Q4 and V_ctrl is applied to the gate of Q5. For M5 to M7, all sources are connected to the sources of Q6 and Q7 and all gates are connected to the drain of Q5. The gate of M5 is also connected to the drain of Q5. The "up" current output to node I_1 and I_3 are taken from the drains of M6 and M7 respectively.

Referring to FIG. 5(b), the compensating "down" current is also regulated by V_ref and V_ctrl. In particular, there are seven transistors (Q8 to Q11 and M8 to M10) forming the current source 511. Q8 to Q11 form a loop source 510 and M8 to M10 are connected in parallel. Within the loop 510, Q10's drain connects to Q8's drain and Q11's drain connects to Q9's drain. The sources of Q8 and Q9 are connected to ground. The sources of Q10 and Q11 are connected to a positive voltage V_dd via a current source 512. The gates of Q8 and Q9 are connected to the drain of Q10. V_ref is applied to the gate of Q10 and V_ctrl is applied to the gate of Q11. For M8 to M10, the sources are connected to the sources of Q8 and Q9 at ground and all gates are connected to the drain of Q9. The gate of M8 is also connected to the drain of Q9. The compensating "down" current output I_2 and I_4 are taken from the drains of M8 and M9 respectively. It will be appreciated that sources 502 and 512 may be mirrored from one current source.

The above-disclosed charge pump circuits provide current mismatch feedback. The feedback will compensate the current mismatch and force "up" and "down" currents closer over a wider V_ds range.

Figure 6:
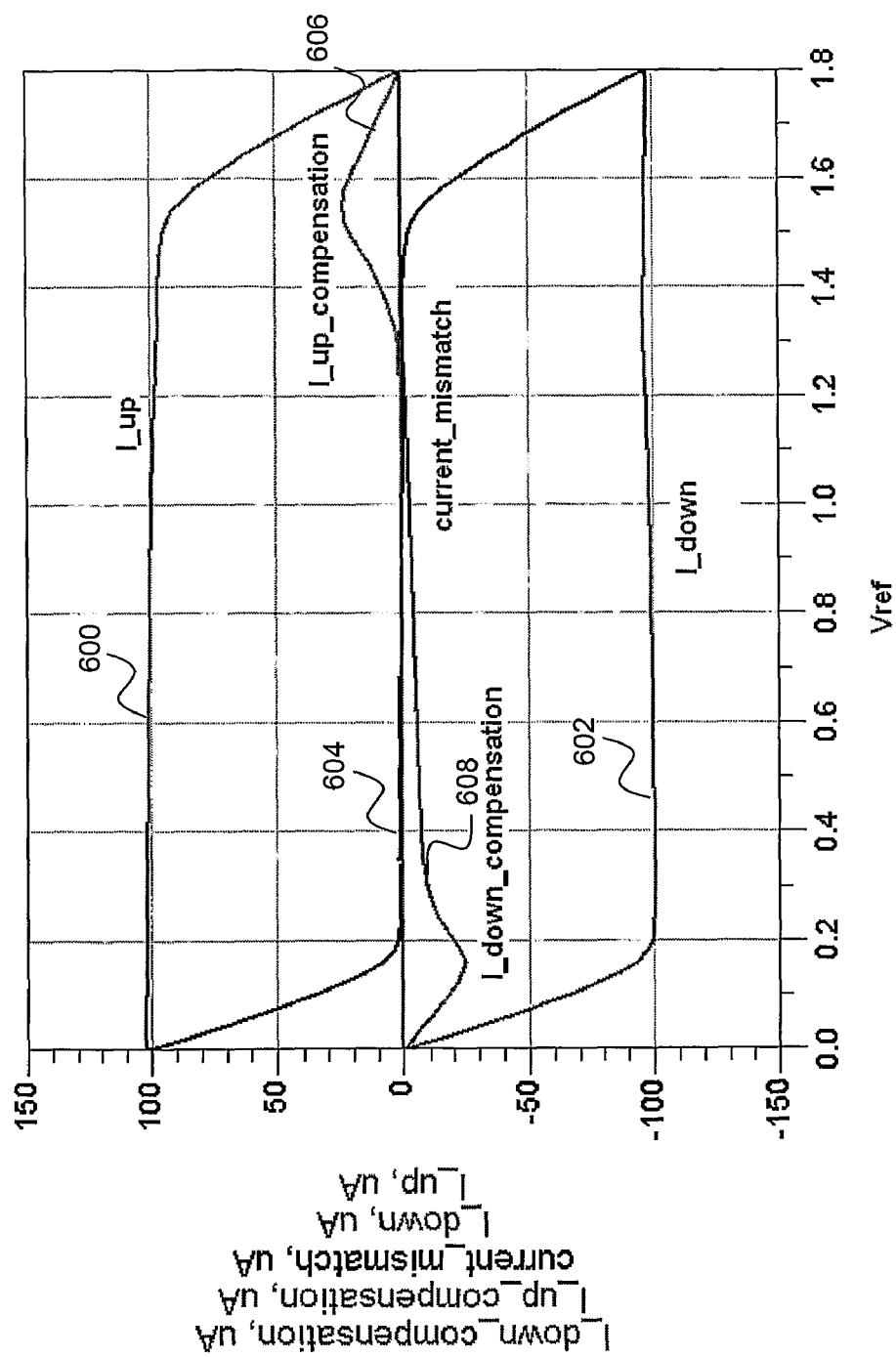
FIG. 6 shows simulation results of the disclosed charge pump circuit.

A simulation result of the disclosed charge pump circuit is presented in FIG. 6. The vertical axis and horizontal axis denotes the mismatch current value in μA and reference voltage value V_ref respectively. In the graph, the "up" current I_up (curve 600) and down current I_down (curve 602) are plotted together with the curve 604 of current mismatch. The graph shows that the current mismatch is less than about 1% when the reference voltage V_ref varies from about 0.2V to about 1.5V, i.e. providing a V_ref range of more than about 1V. Also shown in FIG. 6 are the compensating "up" and "down" currents in curves 606 and 608 respectively.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A charge pump circuit comprising:
a core charge pump circuit;
a replica charge pump circuit for sensing a current mismatch in the core charge pump circuit and for converting the sensed current mismatch into a voltage signal V_ctrl;
wherein V-ctrl is utilized for compensating the current mismatch in the core charge pump circuit;
the core charge pump circuit includes a first n-type transistor and a first p-type transistor, parallel first and second branches between respective drains of the first n-type and the first p-type transistor, each branch including two switch elements, and a voltage follower circuit connected between a V ref input point and CP out point between the switch elements on the first and second branches respectively;
the replica charge pump circuit includes a second n-type transistor and a second n-type transistor, two switch elements of the same type as the switch elements of the core charge pump circuit connected in series between the drains of the second n-type and the second p-type transistor; and a feedback loop with one input taken from a point between the two switch elements of the replica charge pump circuit and V ref supplied to another input of the feedback loop and V-ctrl as the output of the feedback loop; and
further comprising a first current compensating circuit for converting V ctrl into a compensating "up" current, and a second current compensating circuit for converting V ctrl into a compensating "down" current.

2. The charge pump circuit as claimed in claim 1, wherein the compensating "up" current is supplied to the drains of the first and second n-type transistors, and the compensating "down" current is supplied to the drains of the first and second p-type transistors.

3. The charge pump circuit as claimed in claim 1, wherein the first and second compensating circuits comprise respective differential circuits for converting a voltage difference between V_ref and V_ctrl into the compensating "up" and "down" currents respectively.

4. The charge pump circuit as claimed in claim 1, wherein the switch elements comprise transgate switches.

5. The charge pump circuit as claimed in claim 1, wherein current mismatch is substantially compensated over a range of more than about 1V in variation of V_ref.

6. A method of compensating current mismatch in a charge pump circuit, the method comprising:
sensing the current mismatch in the charge pump circuit;
converting the sensed current mismatch into a voltage signal V_ctrl; and
utilizing V-ctrl to compensate the current mismatch;
wherein
a core charge pump circuit includes a first n-type transistor and a first p-type transistor, parallel first and second branches between respective drains of the first n-type and the first p-type transistor, each branch including two switch elements, and a voltage follower circuit connected between a V ref input point and a CP out point between the switch elements on the first and second branches respectively;
a replica charge pump circuit includes a second n-type transistor and a second n-type transistor, two switch elements of the same type as the switch elements of the core charge pump circuit connected in series between the drains of the second n-type and the second p-type transistor; and a feedback loop with one input taken from a point between the two switch elements of the replica charge pump circuit and V ref supplied to another input of the feedback loop and V-ctrl as the output of the feedback loop; and
using a first current compensating circuit for converting V ctrl into a compensating "up" current, and using a second current compensating circuit for converting V ctrl into a compensating "down" current.

* * * * *